United States Patent
Durand-Texte

Patent Number: 6,149,741
Date of Patent: Nov. 21, 2000

[54] COPPER-BASED ALLOY HAVING A HIGH ELECTRICAL CONDUCTIVITY AND A HIGH SOFTENING TEMPERATURE FOR APPLICATION IN ELECTRONICS

[75] Inventor: Gerard Durand-Texte, Paris, France

[73] Assignee: Establissements Griset, France

[21] Appl. No.: 09/329,906

[22] Filed: Jun. 10, 1999

Related U.S. Application Data

[62] Division of application No. 08/899,745, Jul. 24, 1997, abandoned.

[30] Foreign Application Priority Data

Jul. 30, 1996 [FR] France ................... 96 09 575

[51] Int. Cl.[7] ....................... C22F 1/08
[52] U.S. Cl. ............... 148/554; 29/827; 148/685
[58] Field of Search ................ 148/554, 685, 148/680, 681, 682; 257/666–676; 29/827

[56] References Cited

U.S. PATENT DOCUMENTS

| | | | |
|---|---|---|---|
| 2,375,285 | 5/1945 | Crampton | 148/414 |
| 4,466,939 | 8/1984 | Kim | 420/485 |
| 4,620,885 | 11/1986 | Igata | 148/435 |
| 5,334,346 | 8/1994 | Kim | 420/485 |

FOREIGN PATENT DOCUMENTS

| | | |
|---|---|---|
| 0 249 740 | 12/1987 | European Pat. Off. . |
| 3620655 | 12/1987 | Germany . |
| 19643379 | 6/1997 | Germany . |
| 5 200 6334 | 1/1977 | Japan . |
| 5 914 0338 | 8/1984 | Japan . |
| 59-140338 | 8/1984 | Japan . |
| 60 114 546 | 6/1985 | Japan . |
| 62-278243 | 12/1987 | Japan . |
| 3 087 341 | 4/1991 | Japan . |
| 3 104 845 | 5/1991 | Japan . |
| 3-294 458 | 12/1991 | Japan . |
| 4 165 055A | 6/1992 | Japan . |
| 4-311 544 | 11/1992 | Japan . |
| 5226543 | 9/1993 | Japan . |
| 490855 | 11/1975 | U.S.S.R. . |
| 2 158 095 | 11/1985 | United Kingdom . |

*Primary Examiner*—Sikyin Ip
*Attorney, Agent, or Firm*—Baker & Daniels

[57] ABSTRACT

A method for forming supports for use in electronic components. A plate of copper-based alloy including from 0.1 to 1.0% by weight nickel, and from 0.005 to 0.1% by weight of phosphorus is melted and cast. The alloy includes fine precipitates of nickel phosphides throughout the copper matrix. The plate is subjected to a series of deformation operations including, rolling and intermediate annealing at a temperature in the range of 400° to 600° C., with the annealing temperature being maintained for two to four hours, thereby maximizing the production of fine precipitates of nickel phosphides within the alloy. After alloy formation, the plate is coated with a layer of nickel, cut into a desired shape, and secured to an electronic component.

6 Claims, 2 Drawing Sheets

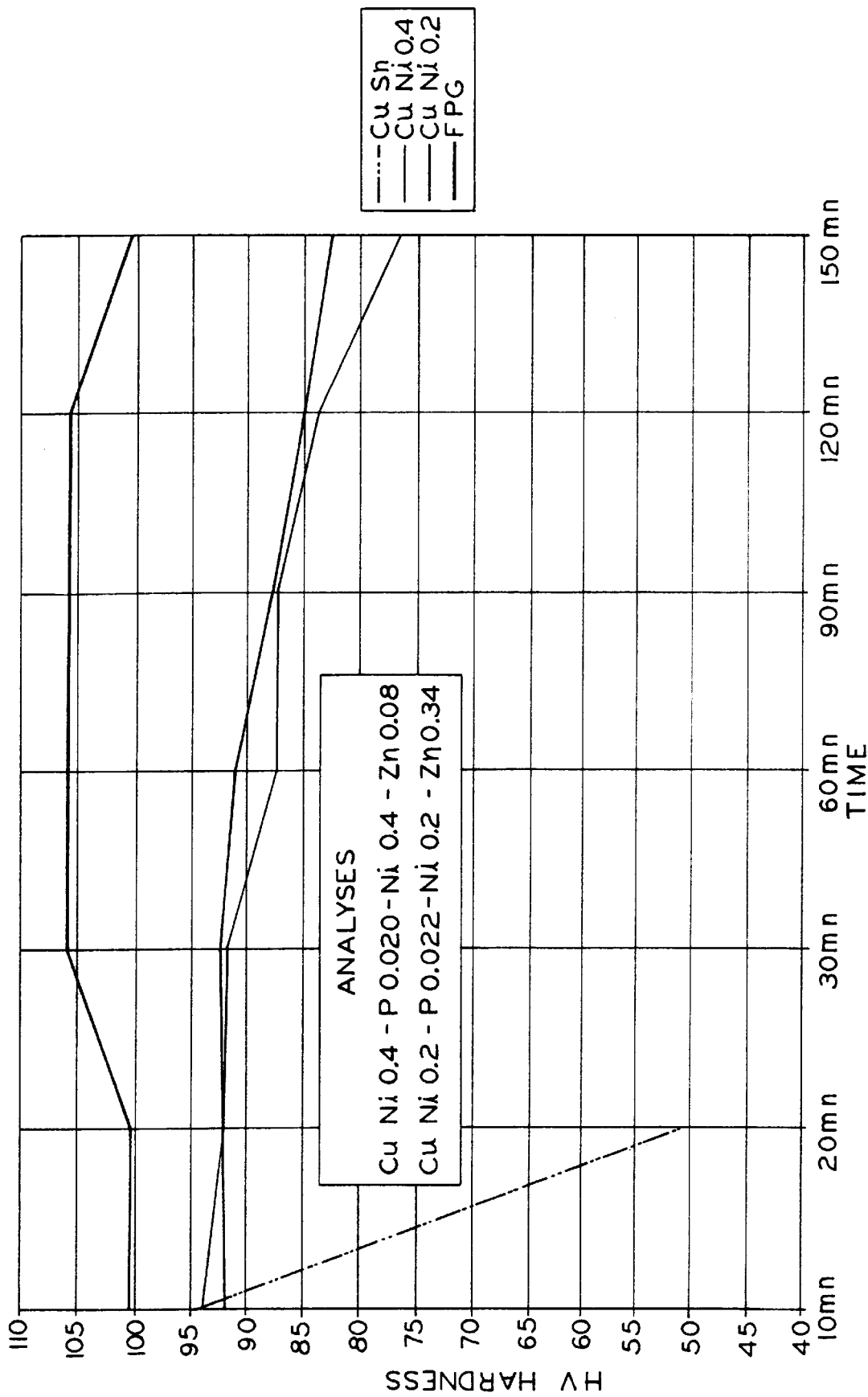

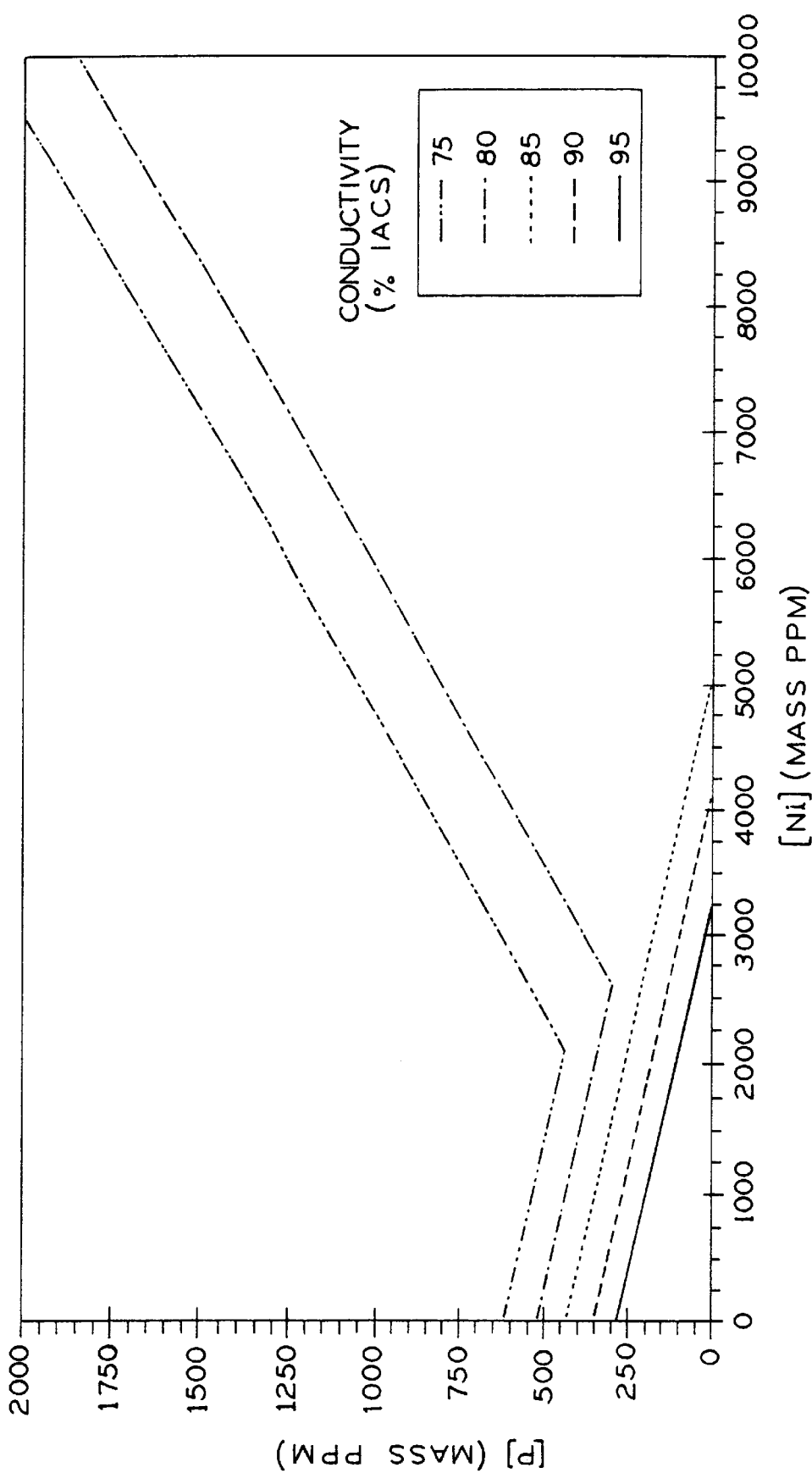

COPPER-BASED ALLOY HAVING A HIGH ELECTRICAL CONDUCTIVITY AND A HIGH SOFTENING TEMPERATURE FOR APPLICATION IN ELECTRONICS

This is a division of application Ser. No. 08/899,745, filed Jul. 24, 1997 now abandoned.

DESCRIPTION OF THE INVENTION

BACKGROUND AND SUMMARY

The present invention relates to copper-based alloys for use in electronics for the manufacture of supports for components.

Copper, which, as is well known, is an excellent conductor of electricity, is used in many applications, especially in electronics; it is used as a support for electronic circuit components (lead frame) for the most varied components and especially electronic chips. In the production of circuits, the components are generally brazed, adhesively bonded and/or crimped and then hot-coated with plastics material on the copper support which must thus be temperature-resistant and preserve its mechanical characteristics.

Owing to this temperature resistance (restoration strength), copper-based alloys have been used; that enables the restoration strength to be increased while preserving a good conductivity.

The temperature strength, or what is referred to as restoration strength, corresponds to a mechanism leading to the softening of the copper alloy by activation of dislocation annihilation by re-heating to a high temperature. Restoration resistance is characterised by the maximum duration (for example longer than 10 minutes) of maintenance at an elevated temperature (for example 450° C.) after which the hardness of the metal remains higher than a predetermined value.

The measured conductivity of the alloy, given as a percentage, corresponds to the 100% conductivity of pure copper. This percentage conductivity is called IACS conductivity.

By way of example, the alloy Cu Sn 0.15, which is an alloy of copper and tin, is used.

The copper supports used in electronics must not only offer good mechanical strength and good temperature strength but they must also exhibit excellent solderability and/or brazing suitability; to that end, the copper alloy is coated with a layer of nickel. This layer of nickel is applied to the alloy before cutting the products, such as supports. This results in a substantial amount of nickel-coated copper alloy waste, which is expensive to recover because it is necessary to use electrolysis to separate the copper from the nickel and to recover it.

BRIEF DESCRIPTION OF THE DRAWINGS

FIG. 1 is a diagram of temperature strength of various alloys over time in accordance with the present invention; and FIG. 2 is a diagram of conductivity as a function of the content of nickel and iron of a pure copper-nickel-phosphorous alloy in accordance with the present invention.

DETAILED DESCRIPTION OF THE INVENTION

The aim of the present invention is to improve copper-based alloys for use in electronics in order to obtain alloys having high temperature strength and high conductivity and facilitating the recovery of manufacturing waste.

To that end, the invention relates to the use, for the manufacture of supports for electronic circuit components that are to be brazed, adhesively bonded and/or crimped at high temperature onto the support, of a copper-based alloy containing, as a percentage by mass, from 0.1 to 1% of nickel and from 0.005 to 0.1% of phosphorus, the remainder being copper or principally copper.

According to the invention, such an alloy may, in addition, contain up to 0.1% of iron and/or up to 0.5% of zinc.

This copper-based alloy has a good conductivity generally higher than 80% IACS in the composition ranges proposed, and also an excellent temperature strength, that is to say, restoration resistance, associated especially with the addition elements: nickel and phosphorus.

The copper-based alloy according to the invention is also very valuable from the economic point of view because it facilitates recycling of the waste occurring during the manufacture of supports or elements for electronics because, in this case, the alloy according to the invention is coated with a layer of nickel. The mechanical characteristics of this alloy are especially valuable.

The alloys according to the present invention offer numerous advantages. For example, their electrical conductivity is very good. It is easy to obtain an electrical conductivity higher than 70% IACS. It is even possible, as demonstrated by the Examples hereinafter, to ensure a conductivity higher than 80% IACS by varying the addition of phosphorus as a function of that of nickel and iron, and by limiting the content of residual elements (zinc, . . . ): special production programmes are therefore to be observed in order to optimise the annealing cycles and the formation fine precipitates of Nickle Phosphides.

The content of residual nickel and phosphorus in solution, after the most extensive precipitation possible, ensures very good resistance to restoration: softening is very slight, as demonstrated by the Examples hereinafter, when the alloy is maintained in a furnace even beyond 450° C. and would be negligible in the case of soldering, brazing or plastic encapsulation at temperatures of between 370 and 425° C.

The precipitates formed (of $Ni_5P_2$ according to the most up-to-date thermodynamic calculations or more certainly of $Ni_2P$ according to analyses effected by loss of energy in transmission microscopy) permit significant hardening of the alloys according to the present invention. At the same time, they increase resistance to stress relief.

The alloys according to the present invention are inexpensive. They use only conventional addition elements. They also enable the nickel-coated copper waste to be recycled economically. Small amounts of impurities (zinc, silicon, . . . ) can be tolerated: according to known laws, they degrade the conductivity of the product. The marginal addition of other alloy elements, such as iron (up to 1000 ppm but preferably less than 100 ppm) can permit acceleration of annealing and an improvement in mechanical characteristics while hardly affecting conductivity.

The alloys according to the present invention are therefore especially suitable for electronic applications (grids, power components, . . . ) and would advantageously replace alloys such as Cu Sn 0.15.

The alloy according to the invention can be manufactured by casting processes normally used for copper-based alloys. The particular process selected for casting the alloy has no particular critical influence on the product obtained.

However, prior homogenisation of the alloy by dissolving all the alloy elements at high temperature (800° C. or more) is very desirable, especially where, for example, iron is added.

In order to obtain boards, it is possible, for example, to cast the alloy in strips, to mill it, then, after slight work-hardening, to subject it to homogenising annealing (from 800 to 850° C. for approximately 1 hour) followed by quench-hardening. It is also possible, and preferable, to cast the alloy in plates of conventional dimensions, and then first to hot-roll them (at from 650 to 1000° C. depending on the alloy elements) to a thickness of a few millimetres and then to cold-roll them.

The alloy can then be cold-rolled to the desired thickness with intermediate annealing operations.

The greatest possible reduction, and at least 50%, is preferable between two consecutive annealing operations: the duration of each annealing operation is thus substantially reduced with an improved final conductivity. The optimum annealing temperatures are between 400 and 600° C., with maintenance at the annealing temperature for at least two hours and, if possible, four hours. Longer durations generally ensure greater conductivity, except in the unfavourable case of competitive precipitations of addition elements with the phosphorus, for example.

The present invention will be explained hereinafter by means of two embodiments of copper-based alloys.

The results of hardness and conductivity measurements are given in appended FIGS. 1 and 2. FIG. 1 is a diagram of temperature strength at 425° C.; the time has been shown on the abscissa and the HV hardness has been shown on the ordinate. The diagram gives the graphs of Cu Sn, Cu Ni 0.4, Cu Ni 0.2 and the alloy FPG, that is to say, an alloy of copper containing from 950 to 1000 ppm Fe and from 330 to 370 ppm P.

The test consisted in increasing the temperature to 425° C. and remaining at that temperature for a period extending beyond the scale of the diagram.

FIG. 2 shows the conductivity graphs for various IACS percentages, the abscissa representing the mass in ppm of Ni and the ordinate representing the mass in ppm of P in the copper-based alloy.

EXAMPLE 1

The alloys of this Example are prepared in the manner indicated hereinafter. Cuttings of copper-phosphorus alloys (Cu-b1, Cu-b2) coated with nickel are melted in a channel induction furnace: at the end of the melting process, on the basis of a spectrometer analysis, adjustment of the content of phosphorus enables the desired composition to be obtained. The molten mass is then maintained for a few minutes at the same temperature (approximately 1200° C.) under a reducing cover of charcoal. Casting is effected in a water-cooled ingot mould measuring 200×400 mm, for example. The composition of the alloys prepared for this Example is given in the following Table.

|  | Ni | P | Fe | Zn |
| --- | --- | --- | --- | --- |
| Cu Ni 0.2 | 2060 | 305 | — | 3200 |
| Cu Ni 0.4 | 4410 | 300 | — | 800 |

(All the contents are given in mass ppm.)

The plates thus cast are reheated to a temperature higher than 840° C. and then hot-rolled to from 200 to 13 mm. They can then, at a temperature higher than 600° C., be either quench-hardened or not, as desired. The blank is then milled, cold-rolled to a thickness of 1.5 mm and then annealed under a hood with maintenance at 480° C. for 4 hours. The hardness in the annealed state is between 54 and 57 HV. The conductivities of the alloys Cu Ni 0.4 and Cu Ni 0.2 measured in this state are, respectively, 78.1% IACS and 79.4% IACS.

The high content of residual zinc has a substantial effect on conductivity. On the basis of the known effect of zinc in solution on conductivity, it is possible to estimate that Cu Ni 0.2 and Cu Ni 0.4 alloys containing no addition element other than nickel and phosphorus at the contents indicated, would have conductivities of 83% IACS and 79% IACS, respectively.

In that metallurgical state, after a fresh reduction by rolling of 20%, the conductivity hardly varies and the hardness reaches from 107 to 110 HV. It is equivalent to that obtained under the same conditions with a Cu Sn 0.15 alloy.

At this level of work-hardening, strip samples are annealed at different temperatures from 360 to 480° C. for 10 minutes. The fall in hardness with temperature in the case of the Cu Ni 0.4 alloy is compared with that measured for a Cu Sn 0.15 alloy. The softening temperature of the Cu Ni 0.4 alloy is higher than 460° C. when that of the Cu Sn 0.15 alloy is of the order of 440° C.

EXAMPLE 2

New alloys, according to this Example, were prepared in the manner indicated hereinafter. High-purity copper is melted in a channel induction furnace: the introduction of alloy elements is effected in the form of pure nickel, copper phosphide 85-15 and metal silicon until the desired composition is obtained. The molten mass is then maintained at the same temperature (approximately 1200° C.) under a charcoal cover. The composition is gradually modified in order to obtain a wide range of different alloys. Billets are taken from the bath and cast for each new composition (diameter: 25 mm, height: 40 mm). The composition of each alloy prepared for this Example is within the ranges indicated in the following Table.

|  | Ni | P | Fe | Si |
| --- | --- | --- | --- | --- |
| minimum | 2870 | <10 | <10 | 0 |
| maximum | 4300 | 910 | 80 | 100 |

(All the contents are given in mass ppm.)

Each of the billets is homogenised by being maintained at 850° C. for 1 hour and then being quench-hardened in water. In that state, they are deformed by more than 70% (reduction in height) by compression in a hydraulic press. They are then annealed in such a manner that, for each alloy, the maximum conductivity is obtained. Correlations were then established between these measured conductivity values and the composition of the alloys. The correlations also take into account the previous characterisations, indicated in Example 1.

Lines of the same conductivity can then be plotted in the plane of the nickel and phosphorus contents, without any other addition element, in the case of pure copper-nickel-phosphorus alloys. The results are indicated in FIG. 2.

What is claimed is:

1. A method for forming supports used in electronic components, said method comprising:

melting and casting a plate of a copper-based alloy comprising copper, from 0.1 to 1% by weight nickel, and from 0.005 to 0.1% by weight phosphorus, the alloy including fine precipitates of nickel phosphides throughout the copper matrix;

subjecting said alloy to a series of deformation operations, the deformation operations including:

rolling and intermediate annealing of said plate at an annealing temperature of 400 to 600° C., said annealing temperature being maintained for two to four hours, to thereby maximize production of the fine precipitates of nickel phosphides within the alloy;

coating the plate with a layer of nickel;

cutting a support of a desired shape and size from the plate;

bringing an electronic component into contact with the support;

fixing the electronic component to the support by one of soldering, brazing, adhesive bonding and crimping; and hot coating the component with plastic material.

2. The method according to claim 1, further comprising producing a homogenization phase of the alloy prior to the deformation operations by melting together the elements of the alloy at a minimum temperature of 800° C.

3. The method according to claim 1, wherein:

the plate is a nickel-coated copper and phosphorus alloy; and wherein the method further comprises adding phosphorus at the end of the melting process.

4. The method according to claim 1, wherein the step of fixing the electronic component to the support is carried out at a temperature in the range of about 370 to 425° C.

5. The method according to claim 1, wherein the copper-based alloy contains up to 0.1% iron.

6. The method according to claim 1, wherein the copper-based alloy contains up to 0.5% zinc.

* * * * *

UNITED STATES PATENT AND TRADEMARK OFFICE
CERTIFICATE OF CORRECTION

PATENT NO. : 6,149,741
DATED : November 21, 2000
INVENTOR(S) : Gerard Durand-Texte It is certified that error appears in the above-identified patent and that said Letters Patent are hereby corrected as shown below:

In the title, please change the word "APPLICATION" to - -APPLICATIONS- -

Signed and Sealed this

Eighth Day of May, 2001

Attest:

NICHOLAS P. GODICI

Attesting Officer    Acting Director of the United States Patent and Trademark Office